United States Patent
Maruyama et al.

(10) Patent No.: US 10,720,328 B2
(45) Date of Patent: Jul. 21, 2020

(54) ETCHING METHOD AND ETCHING APPARATUS

(71) Applicant: Tokyo Electron Limited, Tokyo (JP)

(72) Inventors: Hotaka Maruyama, Gyeonggi-do (KR); Katsunori Tanaka, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/261,855

(22) Filed: Jan. 30, 2019

(65) Prior Publication Data
 US 2019/0237332 A1   Aug. 1, 2019

(30) Foreign Application Priority Data
 Feb. 1, 2018 (JP) ................. 2018-016441

(51) Int. Cl.
 *H01L 21/033* (2006.01)
 *H01L 21/311* (2006.01)
 *H01L 21/306* (2006.01)
 *H01L 21/67* (2006.01)
 *H01L 21/683* (2006.01)
 *H01J 37/32* (2006.01)

(52) U.S. Cl.
 CPC ...... *H01L 21/0338* (2013.01); *H01L 21/0335* (2013.01); *H01L 21/0337* (2013.01); *H01L 21/31116* (2013.01); *H01L 21/31144* (2013.01); *H01L 21/67069* (2013.01); *H01L 21/67109* (2013.01); *H01L 21/6831* (2013.01); *H01J 37/32449* (2013.01); *H01J 2237/334* (2013.01)

(58) Field of Classification Search
 None
 See application file for complete search history.

(56) References Cited

U.S. PATENT DOCUMENTS

| 2011/0226725 | A1* | 9/2011 | Ohashi | B82Y 10/00 216/12 |
| 2011/0250757 | A1* | 10/2011 | Sukekawa | H01L 21/0337 438/703 |
| 2018/0269100 | A1* | 9/2018 | Huang | H01L 21/31144 |

FOREIGN PATENT DOCUMENTS

JP   2014-145634   8/2014

* cited by examiner

*Primary Examiner* — Shamim Ahmed
(74) *Attorney, Agent, or Firm* — IPUSA, PLLC

(57) ABSTRACT

An etching method for etching an etching target film using a first organic film processed to have a plurality of line patterns formed on the etching target film, an oxide film conformally formed on a front surface of the etching target film so as to provide a space between adjacent line patterns, and a second organic film formed to embed the space, includes etching back the second organic film and the oxide film using an etching gas whose etching selection ratio is adjusted for the second organic film based on a line width and a width of the space so as to cause an upper surface of the first organic film to be exposed, removing the oxide film between the line pattern and the space, and etching the etching target film using the first organic film and the second organic film as a mask.

9 Claims, 6 Drawing Sheets

ETCHING METHOD AND ETCHING APPARATUS

CROSS-REFERENCE TO RELATED APPLICATIONS

This patent application is based upon and claims the priority to Japanese Patent Application No. 2018-016441 filed on Feb. 1, 2018, the entire contents of which are incorporated herein by reference.

BACKGROUND OF THE INVENTION

1. Field of the Invention

The present invention generally relates to an etching method and an etching apparatus.

2. Description of the Related Art

There is a line patterning technique in which the pitch of a line pattern once formed using a photolithographic technique is reduced to a half (see, for example, Patent Document 1).

[Patent Document 1] Japanese Laid-open Patent Publication No. 2014-145634

SUMMARY OF THE INVENTION

An etching method for etching an etching target film using a first organic film processed to have a plurality of line patterns formed on the etching target film, an oxide film conformally formed on a front surface of the etching target film so as to provide a space between adjacent line patterns, and a second organic film formed to embed the space, includes etching back the second organic film and the oxide film using an etching gas whose etching selection ratio is adjusted for the second organic film based on a line width and a width of the space so as to cause an upper surface of the first organic film to be exposed, removing the oxide film between the line pattern and the space, and etching the etching target film using the first organic film and the second organic film as a mask.

DETAILED DESCRIPTION OF EMBODIMENTS

Although several means are proposed as the double patterning technique, if line pattern forming methods for adjacent line patterns are different, a difference in line widths (CD: Critical Dimension) of the adjacent lines may be caused.

The object of the present invention is to provide an etching method enabling a CD difference of adjacent lines to be controlled.

A description of embodiments of the present invention is given below, with reference to the FIG. 1 through FIG. 7.

The embodiments described below are only examples and the present invention is not limited to the embodiments.

Through all figures illustrating the embodiments, the same references symbols are used for portions having the same function, and repetitive explanations of these portions are omitted.

Reference symbols typically designate as follows:
1: etching apparatus;
23: gas supply source;
100: control device;
202: etching target film;
203: first organic film;
203a: line pattern;
203b: line pattern;
204: oxide film;
204a: space;
204b: space; and
205: second organic film.

[Overall Structure of Etching Apparatus]

Figure 1:
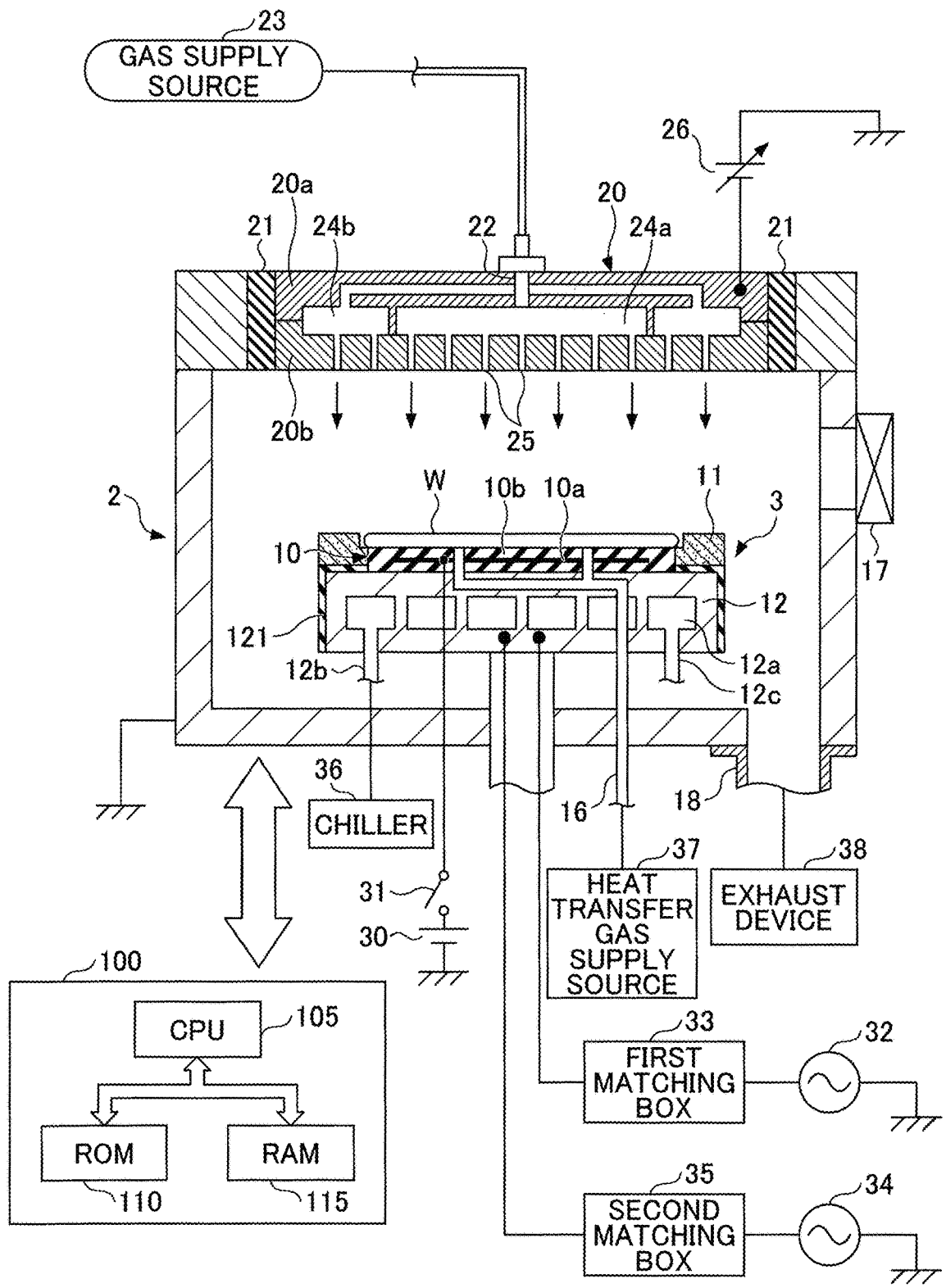
FIG. 1 is a cross-sectional view illustrating an example of an etching apparatus of an embodiment of the present invention.

An example of an etching apparatus of an embodiment of the present invention is described next. FIG. 1 is a cross-sectional view illustrating an example of the etching apparatus of the embodiment of the present invention.

The etching apparatus 1 is a parallel plate plasma processing device of a capacitively coupled plasma (CCP) type. The etching apparatus 1 includes a processing container 2 of a substantially cylindrical shape. The inner surface of the processing container 2 is provided with alumite treatment (an anodic oxidation process). The inside of the processing container 2 is formed as a treatment chamber, in which a plasma process such as an etching process is performed.

The mounting stage 3 mounts a semiconductor wafer (hereinafter, referred to as a "wafer W") as an example of the substrate. The mounting stage 3 includes an electrostatic chuck 10 for adsorbing the wafer W onto the base 12. The mounting stage 3 is held on the bottom portion of the processing container 2. The base 12 is made with aluminum (Al), titanium (Ti), silicon carbide (SiC), or the like. The mounting stage 3 functions also as a lower electrode.

The electrostatic chuck 10 has a structure of sandwiching an electrode 10a inside a dielectric layer 10b. A direct current power source 30 is connected to the electrode layer 10a. When the switch 31 is turned on to apply a direct voltage from the direct current power source 30 to the electrode layer 10a, the wafer W is adsorbed by coulomb force onto the electrostatic chuck 10.

A ring-like focus ring 11 is mounted on the outer peripheral side of the electrostatic chuck 10 so as to surround the outer edge portion of the wafer W. The focus ring 11 is made with, for example, silicon and functions so as to converge plasma onto the surface of the wafer W in the processing container 2. Thus, efficiency of the plasma process can be improved.

A refrigerant flow path 102a is formed inside the base 12. A cooling medium (hereinafter, referred to as a "medium")

such as cooling water and brine output from a chiller 36 flows and circulates through a refrigerant inlet pipe 12b, a refrigerant flow passage 12a, and a refrigerant outlet pipe 12c. The heat of the mounting stage 3 is transferred so that the mounting stage 3 is cooled.

A heat-transfer gas supply source 37 supplies a heat transfer gas such as a helium (He) gas between the front surface of the electrostatic chuck 10 and the back surface of the wafer W after causing the heat transfer gas to pass through a heat-transfer gas supply line 16. Due to this structure, the temperature of the electrostatic chuck 10 is controlled by the cooling medium circulating through the refrigerant flow passage 12a and the heat transfer gas supplied onto the back surface of the wafer W. With this, the wafer W is controlled to be a predetermined temperature.

A first high-frequency power source 32 for supplying high-frequency power HF for plasma generation is connected to the mounting stage 3 through the first matching box 33. A second high-frequency power source 34 for supplying high-frequency power LF for bias voltage generation is connected to the mounting stage 3 through the second matching box 35. The frequency of the high-frequency power HF for the plasma generation may be, for example, 40 MHz. The frequency of the high-frequency power LF for the bias voltage is lower than the frequency of the high-frequency power HF for the plasma generation and is for example 13.56 Hz. Referring to FIG. 1, although the high-frequency power HF is applied to the mounting stage 3, the high-frequency power HF for the plasma generation may be applied to the gas shower head 20.

The first matching box 33 functions such that the internal impedance of the first high-frequency power source 32 seemingly matches a load impedance when plasma is generated inside the processing container 2. The second matching box 35 functions such that the internal impedance of the second high-frequency power source 34 seemingly matches a load impedance when plasma is generated inside the processing container 2.

The gas shower head 20 is disposed in a ceiling portion of the processing container 2. The gas shower head 20 is supported by the processing container 2 through the insulating material 21. The gas shower head 20 includes a main body 20a and a ceiling plate 20b. The main body 20a is made of a conductive material such as aluminum, the surface of which is subjected to anodic oxidation. The ceiling plate 20b is attachably and detachably supported by a lower portion of the main body 20a. The ceiling plate 20b is formed with, for example, silicon. The main body 20a and the ceiling plate 20b are bonded by, for example, an adhesive bond.

The variable direct current power source 26 is connected to the gas shower head to supply a negative direct voltage (DC). The gas shower head 20 is formed with, for example, silicon. The gas shower head 20 also functions as an opposing electrode (an upper electrode) opposing to the mounting stage 3 (a lower electrode).

A gas introducing port 22 for introducing the gas is formed in the gas shower head 20. The inside of the gas shower head 20, a gas diffusion chamber 24a branching from the gas introducing port 22 and a gas diffusion chamber 24b provided on the edge side. Gas output from the gas supply source 23 is supplied to gas diffusion chambers 24a, 24b through a gas introducing port 22, and is diffused in the gas diffusion chambers 24a, 24b, and is introduced from the multiple gas supply apertures 25 toward the mounting stage 3.

An exhaust port 18 is formed on the bottom surface of the processing container 2, and the inside of the processing container 2 is exhausted by an exhaust device 38 connected to the exhaust port 18. With this, the inside of the processing container 2 can be maintained to have a predetermined degree of vacuum. A gate valve 17 is provided in a sidewall of the processing container 2. The gate valve 17 opens and closes when the wafer W is carried into the processing container 2 and is carried out of the processing container 2.

A control device 100 is provided to control an overall operation of the etching apparatus 1. The control device 100 includes a central processing unit (CPU) 105, a read only memory (ROM) 110, and a random access memory (RAM) 115. The CPU 105 performs a predetermined plasma process in conformity with a recipe stored in a memory area such as the RAM 115. Control information of an apparatus with respect to process conditions is set as the recipe. For example, the control information is a processing time, pressure (exhaust gas), high-frequency power, voltage, various gas flow rates, the temperature inside the processing container (the temperature of the upper electrode, the temperature of the sidewall of the processing container, the temperature of the wafer, the temperature of the electrostatic chuck, and so on), and the temperature of the refrigerant output from the chiller 36. Meanwhile, the recipe and the program used by the control device 100 may be stored in a hard disk and a semiconductor memory. Further, the recipe may be stored in a recording medium readable by a portable computer such as a ROM, a DVD, or the like.

When the plasma process is carried out, the gate valve 17 is controlled to be opened and closed so that the wafer W is carried into the processing container 2 and mounted on the mounting stage 3. A positive or negative direct voltage is applied from the direct current power source 30 to the electrode layer 10a, the wafer W is electrostatically adsorbed by the electrostatic chuck 10 and held.

During the process, a predetermined gas is supplied from the gas supply source 23 into the processing container 2 and the high-frequency power HF is applied from the first high-frequency power source 32 to the mounting stage 3. The high-frequency power LF may be applied from the second high-frequency power source 34 to the mounting stage 3. The negative direct voltage may be applied to the gas shower head 20 from the variable direct current power source 26. With this, the gas dissociates above the wafer W to produce plasma, and the wafer W undergoes the plasma process by this function of plasma.

After the plasma process, a direct voltage having a polarity opposite to that in the electrostatic adsorption is applied from the direct current power source 30 to the electrode layer 10a. Therefore, the electric charges of the wafer W are eliminated. After eliminating the electric charges, the wafer W is peeled off from the electrostatic chuck 10 and is carried out of the processing container 2 from the gate valve 17.

[Etching Method]

The etching method of the embodiment of the present invention is to form a pattern on an etching target film using a double patterning technology which reduces the pitch of a line pattern once formed by using the photolithography technique to a half.

Referring to FIGS. 2A to 2D, an example of the etching method of this embodiment is described. FIGS. 2A to 2D are cross-sectional view illustrating the example of the etching method of the embodiment of the present invention. Each of FIGS. 2A to 2D illustrates a part of a center area A and a part of a periphery area B of one cell from among multiple cells formed on the wafer W.

Figure 2A:
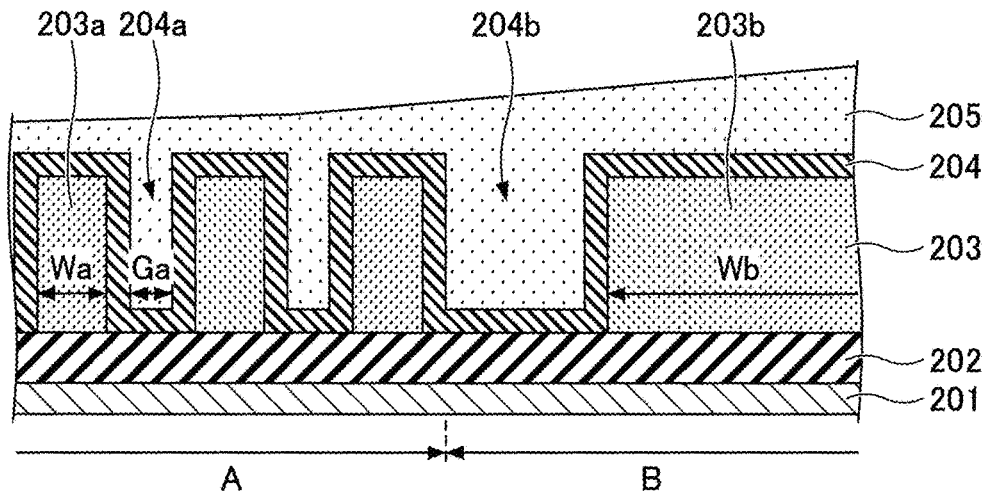
FIGS. 2A-2D are cross-sectional views illustrating an example of an etching method of the embodiment of the present invention.
Figure 2B:
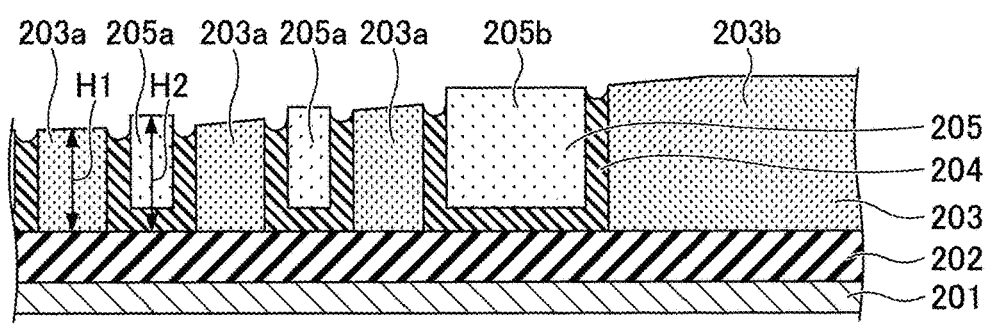

As illustrated in FIG. 2A, the etching target film 202 is deposited on the underlayer film 201 formed on the wafer W. The underlayer film 201 may be an amorphous carbon layer (ACL) film. The etching target film 202 may be, for example, silicon oxynitride (SiON) film. Referring to FIGS. 2A to 2D, the etching target film 202 is deposited on the entire surface of the underlayer film 201.

Subsequently, the first organic film 203 is deposited on the etching target film 202 so as to process the first organic film 203 to be multiple line patterns 203a, 203b using a photolithography technique. The first organic film 203 may be, for example, a spin on carbon (SOC) film or an ACL film. Referring to FIGS. 2A to 2D, the line pattern 203a having a line width Wa is formed in the center area A, and the line pattern 203b having a line width Wb that is wider than the line width Wa is formed in the periphery area B.

Subsequently, the oxide film 204 is conformally formed on the first organic film 203 along a protruding shape of the line patterns 203a, 203b. Here, "conformally" means a case where the film thickness of a film formed on the upper and side surfaces of the protruding shape is the same or substantially the same. The oxide film 204 may be, for example, an ultra-low temperature oxide (ULTO) film, which is formed by an atomic layer deposition (ALD) method or the like. At this time, spaces 204a and 204b are formed between adjacent line patterns 203a and 203b. Referring to FIGS. 2A to 2D, the line width Wa of the line pattern 203a is greater than the width Ga of the spaces 204a.

Figure 2C:
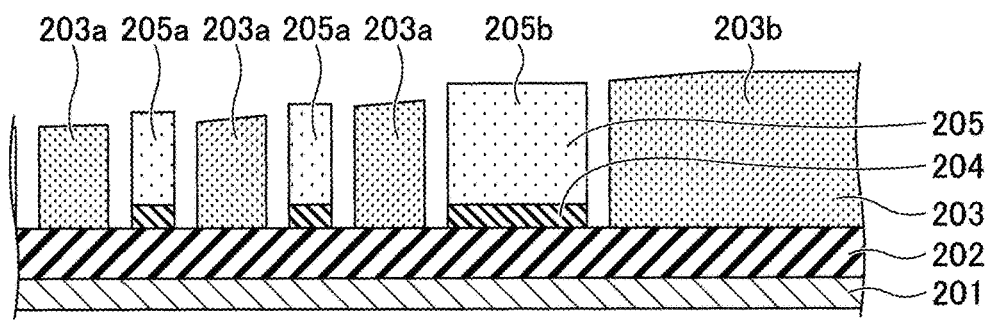
Figure 2D:
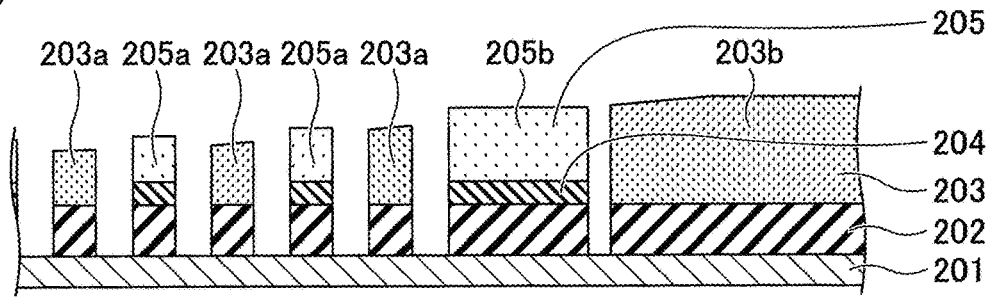

Subsequently, the second organic film 205 is deposited onto the oxide film 204 so as to embed the spaces 204a, 204b. The second organic film 205 is preferably a film that can be embedded into the spaces 204a, 204b without causing a void. The material of the second organic film 205 may be the same as or different from the material of the first organic film 203. The second organic film 205 may be, for example, an SOC layer or an ACL layer. At this time, there is a case where the heights of the second organic films 205 are different depending on a difference of the line widths Wa, Wb, the pitches, or the like of the line patterns 203a, 203b. Referring to FIG. 2D, the heights of the second organic films 205 becomes higher from the center area A to the periphery area B.

Next, the etching gas is supplied so as to simultaneously etch back the second organic film 205 and the oxide film 204, Thus, the upper surface of the first organic film 203 is exposed (an etch-back step). Therefore, a pattern of alternately repeating the line patterns 203a formed by the first organic film 203 and the line patterns 205a formed by the second organic film 205 while interposing the oxide film 204 in the center area A is formed. Further, in the periphery area B, the line pattern 203b made with the first organic film 203 is formed so as to be arranged next to the line pattern 205b made with the second organic film 205 while interposing the oxide film 204. The etch-back step uses the etching gas whose etching selection ratio of the oxide film 204 relative to the second organic film 205 is adjusted depending on the line width Wa of the line pattern 203a and the width Ga of the space 204a. For example, the etching gas having the etching selection ratio of the oxide film 204 relative to the second organic film 205 of greater than one is used. With this, the oxide film 204 tends to be easily etched than the second organic film 205. Therefore, as illustrated in FIG. 23, the height H1 of the line pattern 203a becomes lower than the height H2 of the space 204a. The etching gas may be a gas containing, for example, a fluorocarbon gas and an oxygen-containing gas. The fluorocarbon gas is, for example, $CF_4$ or $CHF_3$. The oxygen-containing gas is, for example, $O_2$.

The etching selection ratio of the oxide film 204 relative to the second organic film 205 is adjustable by changing, for example, an $O_2$ flow rate, a ratio between CF4 and CHF3 flow rates ($CF_4/(CF_4+CHF_3)$ Flow), and the amount and frequency of high-frequency power HF and LF.

Figure 3:
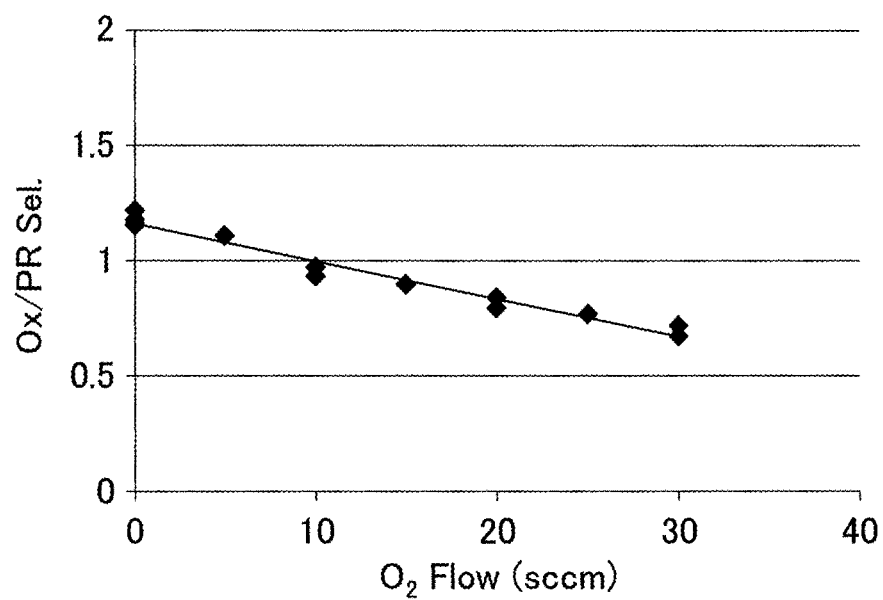
FIG. 3 illustrates a relationship between an $O_2$ flow rate and an etching selection ratio of an oxide film/an organic film.

FIG. 3 illustrates a relationship between an $O_2$ flow rate and the etching selection ratio of the oxide film/the organic film. Referring to FIG. 3, the ordinate axis designates the etching selection ratio of the oxide film/the organic film, and the abscissa axis designates the $O_2$ flow rate. As illustrated in FIG. 3, the etching selection ratio of the oxide film/the organic film can be adjusted by changing the $O_2$ flow rate. For example, by changing the $O_2$ flow rate from 0 sccm to 30 sccm, the etching selection ratio of the oxide film/the organic film can be adjusted in a range of about 1.2 to about 0.7.

Figure 4:
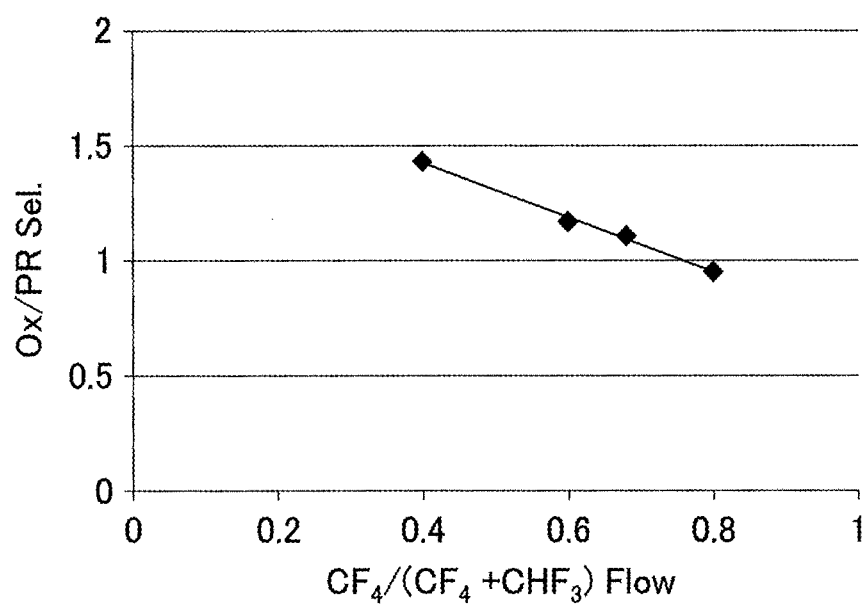
FIG. 4 illustrates a relationship between a ratio between flow rates of $CF_4$ and $CHF_3$ and the etching selection ratio of the oxide film/the organic film.

FIG. 4 illustrates a relation between a ratio between $CF_4$ and CHF3 rates and the etching selection ratio of the oxide film/the organic film $O_2$ flow rate and the etching selection ratio of the oxide film/the organic film. Referring to FIG. 4, the ordinate axis designates the etching selection ratio of the oxide film/the organic film, and the abscissa axis designates the ratio between the $CF_4$ and $CHF_3$ flow rates. As illustrated in FIG. 4, the etching selection ratio of the oxide film/the organic film can be adjusted by changing the ratio between the $CF_4$ and $CHF_3$ flow rates. For example, by changing $CF_4/(CF_4+CHF_3)$ Flow from 0.4 sccm to 0.8 sccm, the etching selection ratio of the oxide film/the organic film can be adjusted in a range of about 1.4 to about 0.9.

Then, the oxide film 204 between the line pattern 203a and the line pattern 205a, the oxide film 204 between the line pattern 203a and the line pattern 205b, and the oxide film 204 between the line pattern 203b and the line pattern 205b are removed (an oxide film removal step). Therefore, as illustrated in FIG. 2C, the etching mask including the line patterns 203a, 203b made with the first organic film 203 and the line patterns 205a, 205b made with the second organic film 205 are formed on the etching target film 202.

Subsequently, the etching mask including line patterns 203a, 203b, 205a, and 206b to etch the etching target film 202 (an etching step). With this, as illustrated in FIG. 2D, the etching target film 202 is processed to be the line pattern. At this time, as the height of the organic film is lower, the line width of the line pattern formed in the etching target film 202 becomes narrower. Therefore, as the line pattern 203a that has the height lower than that of the line pattern 205a and the line width wider than that of the line pattern 205a becomes narrower, the CD difference of adjacent lines in the line pattern formed by the etching target film 202 becomes small.

Next, referring to FIGS. 5A to 5D, another example of the etching method of this embodiment is described. FIGS. 5A to 5D are cross-sectional views illustrating the other example of the etching method of the embodiment of the present invention. Each of FIGS. 5A to 5D illustrates a part of a center area A and a part of a periphery area B of one cell from among multiple cells formed on the wafer W.

Figure 5A:
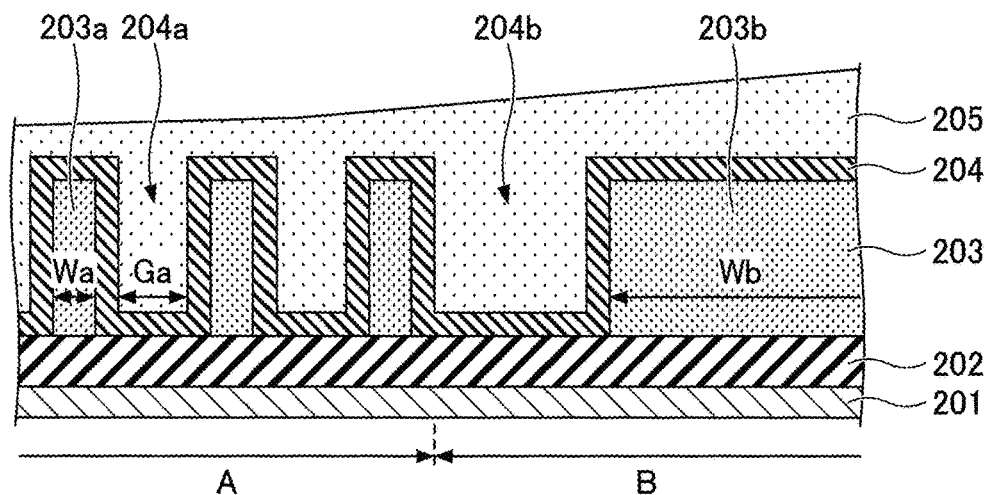
FIGS. 5A-5D are cross-sectional views illustrating another example of the etching method of the embodiment of the present invention.
Figure 5B:
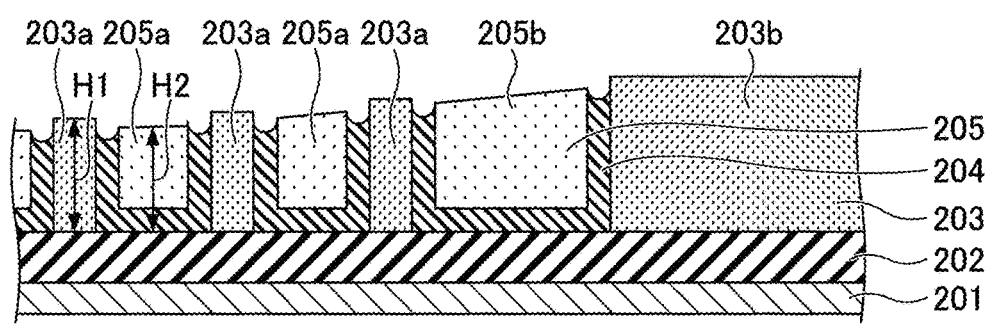

Referring to FIGS. 5A to 5D, the line width Wa of the line pattern 203a is smaller than the width Ga of the space 204a. In this case, in the etch-back step, the etching gas having the etching selection ratio of the oxide film 204 relative to the second organic film 205 of smaller than one is used. With this, the second organic film 205 tends to be easily etched than the oxide film 204. With this, as illustrated in FIG. 5B, the height H2 of the space 204a becomes lower than the height H1 of the line pattern 203a. The etching gas may be a gas similar to that explained with reference to FIGS. 2A to 2D.

Figure 5C:
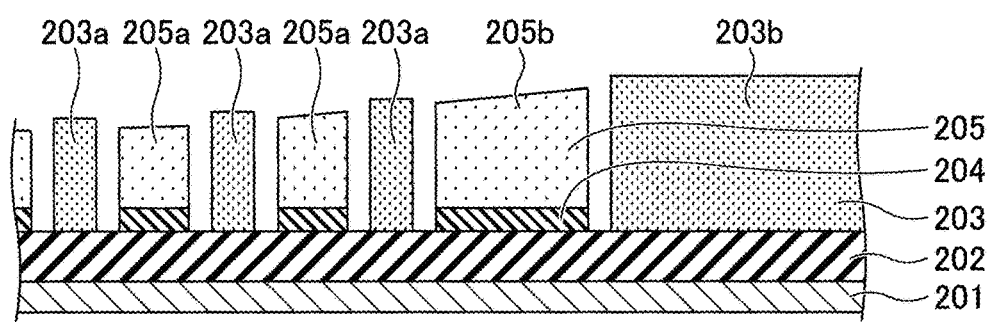

Subsequently, the oxide film removal step is performed in a manner similar to the example illustrated in FIGS. 2A to 2D. As illustrated in FIG. 5C, the etching mask including the line pattern 203a, 203b made with the first organic film 203 and the line pattern 205a, 205b made with the second organic film 205 are formed on the etching target film 202.

Figure 5D:
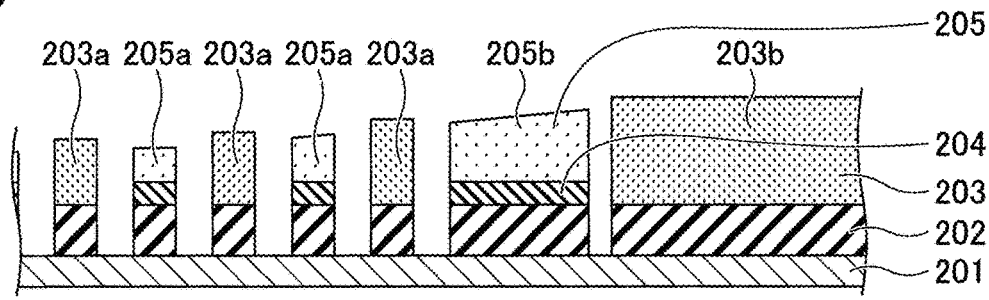

Subsequently, in a manner similar to the example illustrated in FIG. 2D, the etching target film 202 is processed to be the line pattern as illustrated in FIG. 5D. At this time, as the height of the organic film is lower, the line width of the line pattern formed in the etching target film 202 becomes narrower. Therefore, as the line pattern 205a that has the height lower than that of the line pattern 203a and the line width wider than that of the line pattern 203a becomes narrower, the CD difference of adjacent lines in the line pattern formed by the etching target film 202 becomes small.

Next, referring to FIGS. 6A to 6D, another example of the etching method of this embodiment is described. FIGS. 6A to 6D are cross-sectional views illustrating the other example of the etching method of the embodiment of the present invention. Each of FIGS. 6A to 6D illustrates a part of the center area A and a part of the periphery area B of one cell from among multiple cells formed on the wafer W.

Figure 6A:
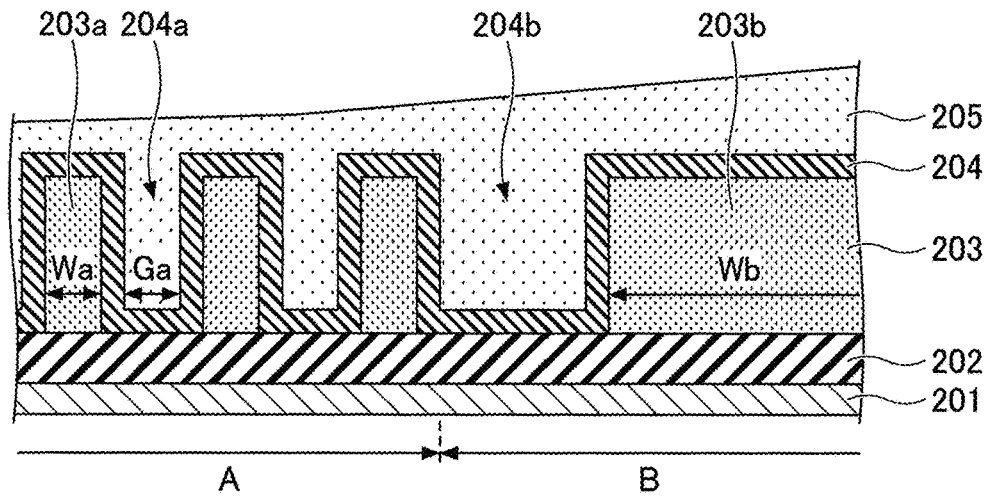
FIGS. 6A-6D are cross-sectional views illustrating another example of the etching method of the embodiment of the present invention.
Figure 6B:
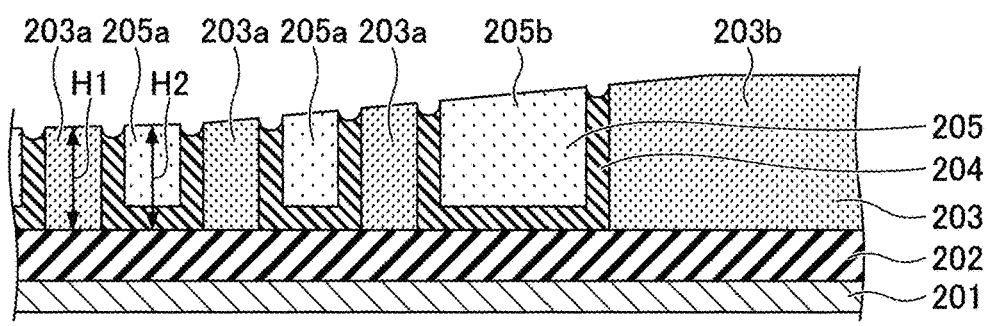

Referring to FIGS. 6A to 6D, the line width Wa of the line pattern 203a is equal to the width Ga of the space 204a. In this case, in the etch-back step, the etching gas having the etching selection ratio of the oxide film 204 relative to the second organic film 205 of one is used. With this, the oxide film 205 and the second organic film 205 are etched at substantially the same etching rate. Therefore, as illustrated in FIG. 6B, the height H1 of the line pattern 203a and the height H2 of the space 204a become substantially the same. The etching gas may be a gas similar to that explained with reference to FIGS. 2A to 2D.

Figure 6C:
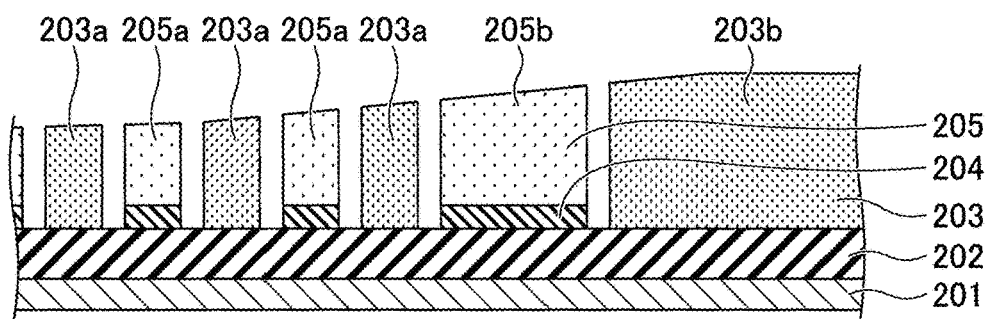

Subsequently, the oxide film removal step is performed in a manner similar to the example illustrated in FIGS. 2A to 2D. As illustrated in FIG. 6C, the etching mask including the line pattern 203a, 203b made with the first organic film 203 and the line pattern 205a, 205b made with the second organic film 205 are formed on the etching target film 202.

Figure 6D:
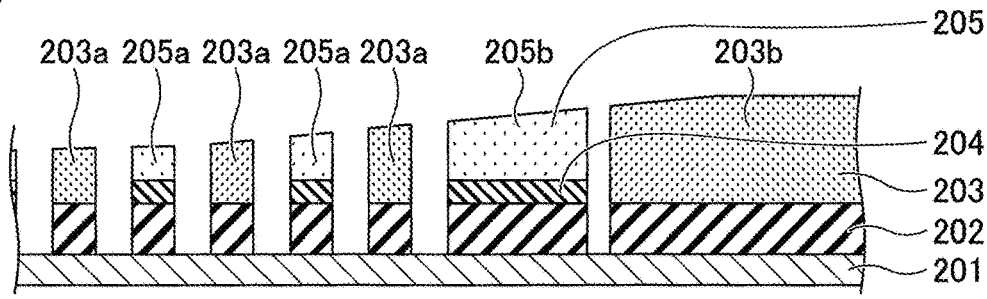

Subsequently, in a manner similar to the example illustrated in FIG. 2D, the etching target film 202 is processed to be the line pattern as illustrated in FIG. 6D. At this time, the line width Wa of the line pattern 203a of the first organic film 203 is substantially the same as the width Ga of the space 204a, and the height H1 of the line pattern 203a of the first organic film 203 and the height H2 of the space 204a are substantially the same. Therefore, the CD difference of adjacent lines in the line pattern that etching target film 202 scarcely occurs.

Within the embodiment, the second organic film 205 and the oxide film 204 are etched back based on the line width Wa of the line pattern and width Ga of the space 204a, using the etching gas whose etching selection ratio of the oxide film 204 relative to the second organic film 205 is adjusted. With this, the CD difference of adjacent lines in the line pattern that is formed on the etching target film 202 can be controlled.

Further, in a case where the line width Wa of the line pattern 203a is wider than the width Ga of the space 204a, an etching gas having the etching selection ratio of the oxide film 204 relative to the second organic film 205 being greater than 1 is used in the etch-back step.

With this, as the line pattern 203a that has the line width wider than that of the line pattern 205a becomes narrower, the CD difference of adjacent lines in the line pattern formed by the etching target film 202 becomes small.

Further, in a case where the line width Wa of the line pattern 203a is narrower than the width Ga of the space 204, an etching gas having the etching selection ratio of the oxide film 204 relative to the second organic film 205 being smaller than 1 is used in the etch-back step. With this, as the line pattern 205a that has the line width wider than that of the line pattern 203a becomes narrower, the CD difference of adjacent lines in the line pattern formed by the etching target film 202 becomes small.

Further, in a case where the line width Wa of the line pattern 203a is equal to the width Ga of the space 204, an etching gas having the etching selection ratio of the oxide film 204 relative to the second organic film 205 being 1 is used in the etch-back step. With this, the CD difference of adjacent lines in the line pattern that etching target film 202 scarcely occurs.

Further, in the etch-back step, the second organic film 205 and the oxide film 204 can be simultaneously etched back. With this, not only the CD difference of the line pattern that is formed on the etching target film 202 in the center area A but also the CD difference of the line pattern that is formed on the etching target film 202 in the periphery area B can be reduced.

EXAMPLES

Described next is examples of performing an etching method whose effects are confirmed. Within the examples, a CD difference of adjacent lines in the line pattern formed by the etching target film 202 when the etching selection ratio of the oxide film/the organic film by the etching gas used in the etch-back step is evaluated. A sample having the line width Wa of the line pattern 203a is smaller than the width Ga of the space 204a in the center area is used.

Figure 7:
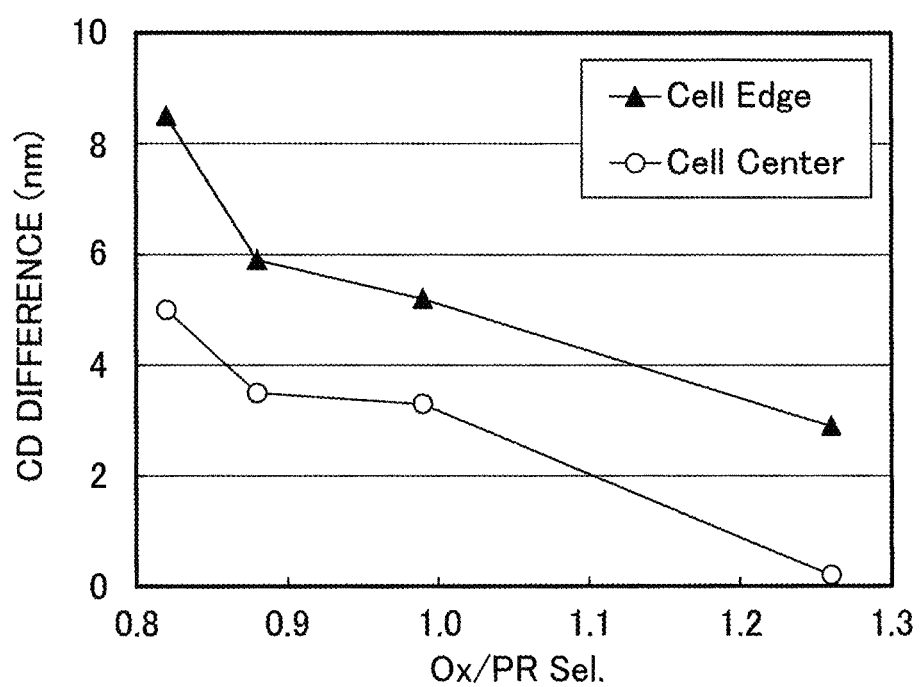
FIG. 7 illustrates a relationship between the etching selection ratio of the oxide film/the organic film and a CD difference.

FIG. 7 illustrates a relationship between the etching selection ratio of the oxide film/the organic film and the CD difference. Referring to FIG. 7, the ordinate axis designates the CD difference (nm) of the adjacent lines in the line pattern formed on the etching target film 202, and the abscissa axis designates the etching selection ratio of the oxide film/the organic film by the etching gas used in the etch-back step. Blank circle marks indicate results obtained in the center area A. Triangle marks indicate results obtained in the periphery area B.

As illustrated in FIG. 7, a CD difference of adjacent lines in the line pattern formed by the etching target film 202 can be adjusted when the etching selection ratio of the oxide film/the organic film by the etching gas used in the etch-back step is controlled. The CD difference of the adjacent lines in the center area A and the periphery area B can be reduced when the etching selection ratio of the oxide film/the organic film is increased. The CD difference of the adjacent lines in the center area A and the periphery area B can be extremely reduced when the etching selection ratio of the oxide film/the organic film is set to be greater than 1.

Within the embodiments, a capacitively-coupled parallel-plate type plasma processing apparatus has been exemplified for explanation as the etching apparatus 1. However, the present invention is not limited thereto. The other plasma processing apparatus may be an inductively-coupled type plasma (ICP: Inductively Coupled Plasma), a plasma processing apparatus using a radial line slot antenna, a helicon wave excitation type plasma (HWP: Helicon Wave Plasma) apparatus, an electron cyclotron resonance plasma (ECR: Electron Cyclotron Resonance Plasma) apparatus, or the like.

Within the embodiments, the semiconductor wafer is exemplified as the substrate. However, the present invention is not limited thereto. The substrate may be a large substrate for a flat panel display (FPD), an EL element, or a substrate for an EL element or a solar cell.

Thus, according to this etching method, the CD difference of the adjacent lines can be controlled.

All examples and conditional language recited herein are intended for pedagogical purposes to aid the reader in understanding the invention embodiments and the concepts contributed by the inventor to furthering the art, and are to be construed as being without limitation to such specifically recited examples and conditions, nor does the organization of such examples in the specification relate to a showing of superiority or inferiority of the invention embodiments. Although the etching method of the present invention has been described in detail, it should be understood that the various changes, substitutions, and alterations could be made hereto without departing from the spirit and scope of the invention.

What is claimed is:

1. An etching method for etching an etching target film using
    a first organic film processed to have a plurality of line patterns formed on the etching target film,
    an oxide film conformally formed on a front surface of the etching target film so as to provide a space between adjacent line patterns, and
    a second organic film formed to embed the space, the etching method comprising:
        an etch-back step for etching back the second organic film and the oxide film using an etching gas whose etching selection ratio is adjusted for the second organic film based on a line width and a width of the space so as to cause an upper surface of the first organic film to be exposed;
        an oxide film removal step for removing the oxide film between the line pattern and the space after the etch-back step; and
        an etching step for etching the etching target film using the first organic film and the second organic film as a mask after the oxide film removal step.

2. The etching method according to claim 1, wherein, in a case where a line width of the line pattern is greater than a width of the space, an etching gas having an etching selection ratio of the oxide film with respect to the second organic film greater than 1 is used in the etch-back step.

3. The etching method according to claim 1, wherein in a case where a line width of the line pattern is smaller than a width of the space, an etching gas having an etching selection ratio of the oxide film with respect to the second organic film smaller than 1 is used in the etch-back step.

4. The etching method according to claim 1, wherein in a case where a line width of the line pattern is equal to a width of the space, an etching gas having an etching selection ratio of the oxide film with respect to the second organic film being 1 is used in the etch-back step.

5. The etching method according to claim 1, wherein the etching gas contains a fluorocarbon gas and an oxygen-containing gas.

6. The etching method according to claim 5, wherein the etching selection ratio is adjusted by changing a flow rate of the oxygen-containing gas.

7. The etching method according to claim 5, wherein the fluorocarbon gas contains $CF_4$ and $CF_3$, and the etching selection ratio is adjusted by changing a ration of the flow rates of $CF_4$ and $CHF_3$.

8. The etching method according to claim 1, wherein materials of the first organic film and the second organic film are the same.

9. The etching method according to claim 1, wherein line widths of the plurality of line patterns are different.

* * * * *